(12) United States Patent
Sung

(10) Patent No.: US 7,018,899 B2
(45) Date of Patent: Mar. 28, 2006

(54) METHODS OF FABRICATING LATERAL DOUBLE-DIFFUSED METAL OXIDE SEMICONDUCTOR DEVICES

(75) Inventor: Woong Je Sung, Bucheon-si (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 11/026,424

(22) Filed: Dec. 30, 2004

(65) Prior Publication Data

US 2005/0142786 A1    Jun. 30, 2005

(30) Foreign Application Priority Data

Dec. 31, 2003  (KR) ...................... 10-2003-0101107

(51) Int. Cl.
*H01L 21/336*   (2006.01)
(52) U.S. Cl. ...................................... 438/270; 438/271
(58) Field of Classification Search ................ 438/271, 438/270, 268
See application file for complete search history.

(56) References Cited

U.S. PATENT DOCUMENTS

| | | | | |
|---|---|---|---|---|
| 4,300,150 | A | | 11/1981 | Colak .......................... 257/336 |
| 4,398,339 | A | * | 8/1983 | Blanchard et al. .......... 438/271 |
| 5,369,045 | A | | 11/1994 | Ng et al. ..................... 438/286 |
| 5,466,616 | A | * | 11/1995 | Yang ............................ 438/197 |
| 5,473,176 | A | * | 12/1995 | Kakumoto ................... 257/192 |
| 5,811,850 | A | | 9/1998 | Smayling et al. ........... 257/335 |
| 5,956,583 | A | * | 9/1999 | Fuller .......................... 438/218 |
| 6,046,088 | A | * | 4/2000 | Klein et al. .................. 438/296 |
| 6,144,069 | A | * | 11/2000 | Tung ........................... 257/335 |
| 6,313,000 | B1 | * | 11/2001 | Kitch .......................... 438/309 |
| 6,316,299 | B1 | * | 11/2001 | Tung ........................... 438/197 |
| 6,372,579 | B1 | * | 4/2002 | Tung ........................... 438/270 |
| 6,440,816 | B1 | * | 8/2002 | Farrow et al. .............. 438/401 |
| 6,483,149 | B1 | | 11/2002 | Mosher et al. .............. 257/356 |
| 6,531,355 | B1 | | 3/2003 | Mosher et al. .............. 438/227 |
| 6,713,814 | B1 | * | 3/2004 | Koscielniak ................. 257/330 |
| 6,723,605 | B1 | * | 4/2004 | Erhardt et al. .............. 438/258 |
| 6,777,293 | B1 | * | 8/2004 | Koscielniak ................. 438/259 |

OTHER PUBLICATIONS

Robb, Stephen P. et al., *Recent Advances in Power Circuits with High Level Integration*, Proceedings of the 6th International Symposium on Power Semiconductor Devices & IC's, pp. 343-348, (May 31-Jun. 2, 1994).

Rumennik, V., *A 1200 CiCMOS Technology and Its Applications*, Proceedings of 1992 International Symposium on Power Semiconductor Devices & IC's, pp. 322-327.

* cited by examiner

*Primary Examiner*—Matthew Smith
*Assistant Examiner*—Lex H. Malsawma
(74) *Attorney, Agent, or Firm*—Hanley, Flight & Zimmerman, LLC

(57) ABSTRACT

Methods for fabricating LDMOS transistors are disclosed. A disclosed method includes: forming a device isolation structure in a semiconductor substrate through an STI process; forming a photoresist pattern exposing the device isolation structure; forming double diffused wells by implanting ions into the substrate; removing the exposed device isolation structure; and removing the photoresist pattern.

4 Claims, 3 Drawing Sheets

METHODS OF FABRICATING LATERAL DOUBLE-DIFFUSED METAL OXIDE SEMICONDUCTOR DEVICES

FIELD OF THE DISCLOSURE

The present disclosure relates generally to lateral double-diffused metal oxide semiconductor devices (hereinafter referred to as "LDMOS") and, more particularly, to methods of fabricating LDMOS transistors.

BACKGROUND

Because MOS field effect transistors (hereinafter referred to as "MOSFETs") have higher input impedance than bipolar transistors, their power gains are high and their gate driving circuits are very simple. Generally, when devices are turned off, minority carrier storage or minority carrier recombination causes time delay. However, because the MOSFET is a unipolar device, it does not experience any such time delay. Thus, applications (e.g., switching mode power supplies, lamp ballast and motor driving circuits), for MOSFETs are expanding. MOSFETs usually adopt the DMOSFET(double diffused MOSFET) structure embodied by planar diffusion technology. A typical LDMOS transistor is described in Sel Cloak, U.S. Pat. No. 4,300,150. Also, an LDMOS transistor integrated with a CMOS transistor and a bipolar transistor, was described on pages 322–327 of the "ISPSD 1992" in a paper entitled "A 1200 BiCMOS Technology and Its Application", by Vladimir Rumenik and on pages 343–348 of the "ISPSD 1994" in a paper entitled "Recent Advances in Power Integrated Circuits with High Level Integration," by Stephen P, Robb.

It is important for DMOS transistors to be employed with power devices which can handle high voltage. Such power devices have good current handling capacity per unit area or a good ON-resistance per unit area. Because the voltage ratio is fixed, the ON-resistance per unit area can be reduced by decreasing a cell area of the MOS device.

In the field of power transistors, a cell pitch of a device is determined by the combined width of a polysilicon region and a contact region, which form a gate electrode and a source electrode, respectively. Reducing a P-type well junction depth is a well-known technique for diminishing the width of a polysilicon region in a DMOS power transistor. However, the breakdown voltage restricts the junction depth.

A conventional LDMOS device is well suited to VLSI processes due to its simple structure. Nevertheless, these LDMOS devices have been regarded as less attractive than VDMOS (vertical DMOS) devices. Recently, RESURF (reduced surface field) LDMOS devices have been shown to have a good ON-resistance characteristic. However, their structure is very complex, they can only be applied for devices whose sources are earthed, and they are difficult to use in other applications.

Particularly, in the past, DMOS transistors were used as discontinuous power transistors or elements of monolithic integrated circuits. Because DMOS transistors are fabricated using a self-aligned manufacturing procedure, they basically comprise a semiconductor substrate.

To form a self-aligned channel region with a gate electrode, a channel body region is generally formed by implanting either p-type dopants or n-type dopants through apertures within a mask, which is made of materials for the gate electrode. A source region is formed by implanting conductive dopants opposite to what are used for the channel body region. The source region is then self-aligned to both the gate electrode and the channel body region. This is a reason why the DMOS transistor has a compact structure.

Referring to FIG. 1, an LDMOS transistor device 10 actually has two LDMOS transistors 10a and 10b.

The transistor device 10a is formed on a SOI (silicon on insulator) substrate comprising a silicon substrate 11, a buffer oxide layer 12 and a semiconductor layer 14. In the illustrated example, the semiconductor layer 14 is formed over the silicon substrate 11. This prior art FET (field effect transistor) comprises a source region 16a and a drain region 18a. The N-type doped source region 16a is formed within a P-type doped well region 20. The well region 20 is often called a P-type body. The P-type body 20 may extend to the upper surface of the buffer oxide layer 12 or be only within the semiconductor layer 14.

The drain region 18a is in contact with one end of a field insulation region 23a. The field insulation region 23a includes a field oxide layer such as a thermally grown silicon oxide layer.

A gate electrode 26a is formed on the surface of the semiconductor layer. The gate electrode 26a extends from the upper part of the source region 16a to the upper part of the field insulation region 23a. It is made of polysilicon doped with impurities. The gate electrode 26a is isolated from the semiconductor layer 14 by a gate dielectric 28a. The gate dielectric 28a may comprise oxide, nitride or a combination thereof (e.g., a stacked NO or ONO layer)

Sidewall insulation regions (not shown) may be formed on the sidewalls of the gate electrode 26a. The sidewall insulation regions commonly comprise oxide such as silicon oxide or nitride such as silicon nitride.

A body region 30 doped at a high concentration exists within the P-type body 20. This body region 39 is in good contact with the P-type body 20. It is doped at a higher concentration than the P-type body 20.

A source contact plug 34 and a drain contact plug 32a exist within the transistor device 10a. These contact plugs (34 and 32a) are provided to electrically connect the source region 16a and the drain region 18a to other elements of the circuit. Referring to FIG. 1, the single contact plug 34 is used for the source regions, 16a and 16b, of the two transistors, 10a and 10b. The prior art technology described above is further described in Ng et al., U.S. Pat. No. 5,369,045.

However, during a diffusion process for forming channels, the prior art requires a thermal treatment process at a high temperature, which affects devices badly.

DETAILED DESCRIPTION

Figure 1:
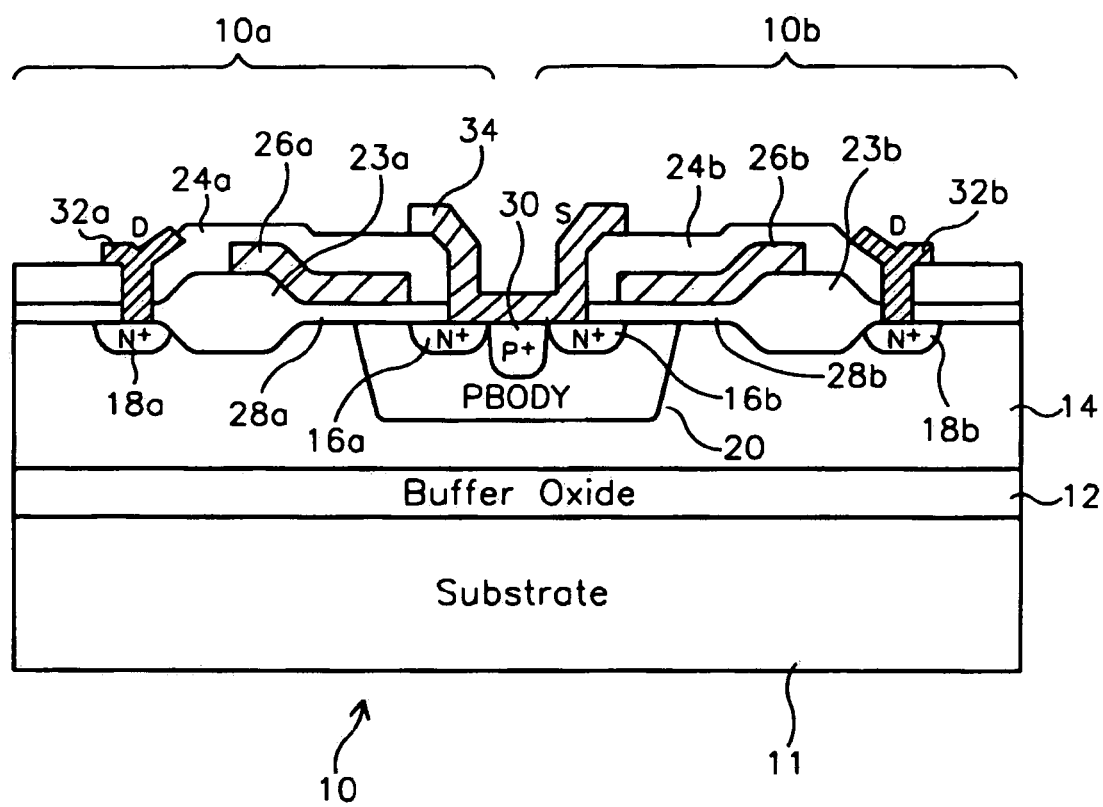
FIG. 1 is a cross-sectional view illustrating a prior art LDMOS device.
Figure 2A:
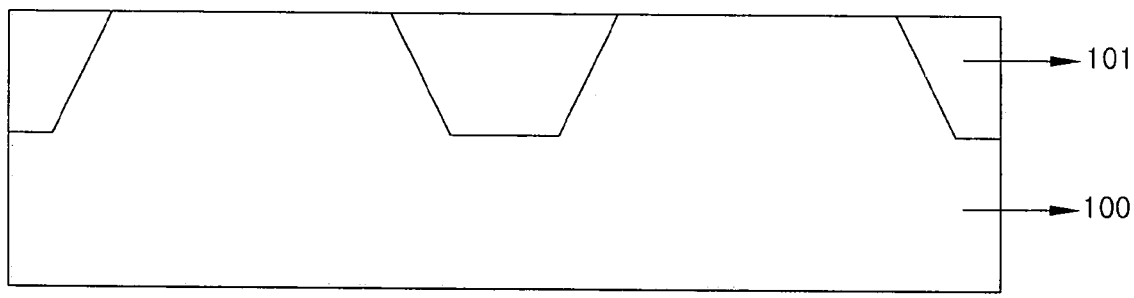
FIGS. 2a through 2d are cross-sectional views illustrating an example process of fabricating an LDMOS device performed in accordance with the teachings of the present invention.

Referring to FIG. 2a, plural device isolation structures are formed by a shallow trench isolation (hereinafter referred to as "STI") process. More specifically, a pad oxide layer is first formed on a semiconductor substrate 100. A nitride layer is formed on the pad oxide layer. Next, a photoresist layer is provided on the nitride layer. The photoresist layer is then patterned. A trench for device isolation is formed by etching the substrate using the photoresist pattern as a mask.

The photoresist pattern is then removed. Finally, an insulation layer is formed on the substrate. Device isolation structures 101 are then formed by performing a planarization process. During the planarization process, the nitride layer is used as an etching stop layer. Thus, when the nitride layer is exposed, the planarization process is stopped and the nitride layer is removed.

Figure 2B:
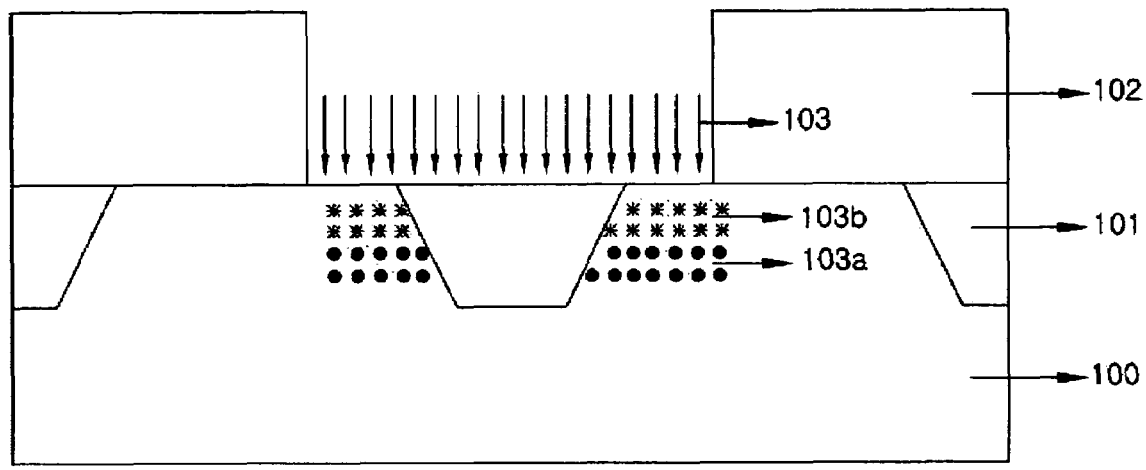

Referring to FIG. 2b, a photoresist pattern 102 is formed on the substrate where the device isolation structures 101 are formed. In the illustrated example, the photoresist pattern is patterned to expose the region on which an LDMOS structure is to be formed. Next, ions are implanted into the exposed region 103 by using both the photoresist pattern and the device isolation structure as masks. In the illustrated example, Ga ions or B ions, (a Group 13 element), are implanted to form a P-type ion-implanted layer 103a. Then, P ions or As ions, (a fifth family element), are implanted to form an N-type ion-implanted layer 103b.

Figure 2C:
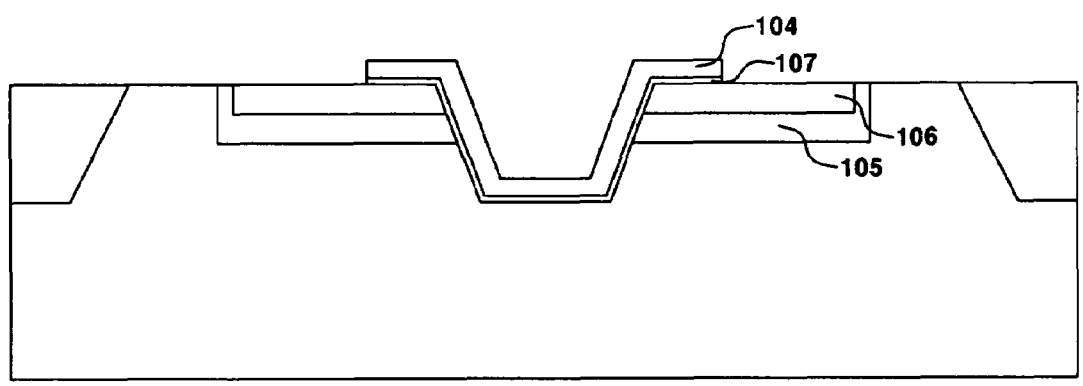

Referring to FIG. 2c, a self-aligned double diffused well is formed and the device isolation structure of the open region is removed. Specifically, the ion-implanted layers are diffused to form a P-type well 105 and an N-type well 106 by performing rapid thermal processing (hereinafter referred to as "RTP") on the ion-implanted substrate. A short channel may be automatically formed by adjusting the implant energy of the Group B element and the Group 15 element. The substrate in which the P-type well 105 and the N-type well 106 are formed is then wet etched to remove the device isolation structure of the open region. After a gate oxide layer 107 and a polysilicon layer are deposited on the substrate, a gate electrode 104 is formed by patterning the polysilicon layer and the gate oxide layer 107. Finally, the photoresist pattern is removed.

Figure 2D:
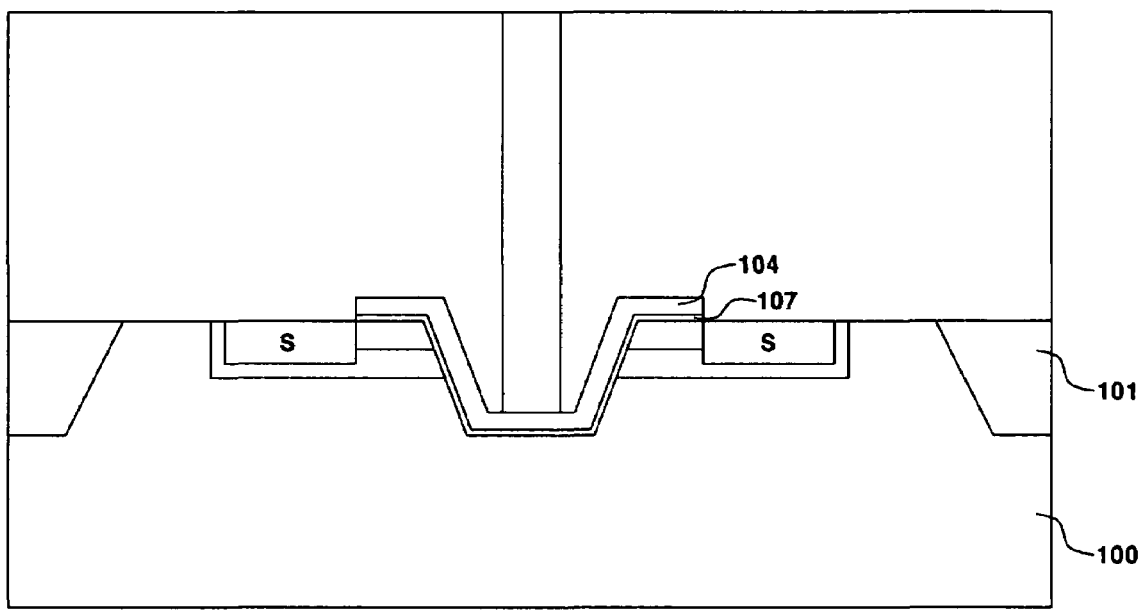

Referring to FIG. 2d, an LDMOS is subsequently completed by performing well-known processes.

In view of the foregoing, persons of ordinary skill in the art will appreciate that the disclosed methods can form self-aligned double diffused wells by using the insulation layers of STI regions as masks and by adjusting ion implant energies. As a result, a high temperature thermal treatment process can be skipped. Consequently, the illustrated method fabricates a semiconductor with a narrow linewidth.

It is noted that this patent claims priority from Korean Patent Application Serial Number 10-2003-0101107, which was filed on Dec. 31, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly within the scope of the appended claims either literally or under the doctrine of equivalents.

What is claimed is:

1. A method of fabricating an LDMOS transistor comprising:

forming a device isolation structure in a semiconductor substrate through an STI process;

forming a photoresist pattern exposing the device isolation structure;

implanting ions into the substrate to form double diffused wells, wherein the exposed device isolation structure and the photoresist pattern are used as masks for implanting the ions;

removing the exposed device isolation structure; and removing the photoresist pattern.

2. A method as defined by claim 1, further comprising depositing and patterning both a gate oxide layer and a polysilicon layer to form a gate electrode after the device isolation structure is removed.

3. A method as defined by claim 1, further comprising performing an RTP to form the double diffused wells.

4. A method as defined by claim 1, wherein removing the exposed device isolation structure comprises wet etching the exposed device isolation structure.

* * * * *